(12) United States Patent
Smalley et al.

(10) Patent No.: US 7,494,639 B2
(45) Date of Patent: Feb. 24, 2009

(54) PURIFICATION OF CARBON NANOTUBES BASED ON THE CHEMISTRY OF FENTON'S REAGENT

(75) Inventors: Richard E. Smalley, Houston, TX (US);
Irene Morin Marek, legal representative, Houston, TX (US);
Yuhuang Wang, Evanston, IL (US);
Robert H. Hauge, Houston, TX (US);
Hongwei Shan, Houston, TX (US)

(73) Assignee: William Marsh Rice University, Houston, TX (US)

( * ) Notice: Subject to any disclaimer, the term of this patent is extended or adjusted under 35 U.S.C. 154(b) by 505 days.

(21) Appl. No.: 11/319,707

(22) Filed: Dec. 28, 2005

(65) Prior Publication Data

US 2007/0065975 A1 Mar. 22, 2007

Related U.S. Application Data

(60) Provisional application No. 60/639,500, filed on Dec. 28, 2004.

(51) Int. Cl.
*C01B 31/02* (2006.01)
*B82B 3/00* (2006.01)
(52) U.S. Cl. ...................... 423/461; 977/845
(58) Field of Classification Search ................. 423/461; 977/845
See application file for complete search history.

(56) References Cited

U.S. PATENT DOCUMENTS

| 7,135,160 | B2 | 11/2006 | Yang et al. |
| 2002/0127169 | A1* | 9/2002 | Smalley et al. ............ 423/447.1 |
| 2003/0039604 | A1 | 2/2003 | Niu Chunming et al. |

FOREIGN PATENT DOCUMENTS

| JP | 2003-089510 | 3/2003 |
| WO | WO9839250 | 9/1998 |

OTHER PUBLICATIONS

Capes, L., et al.: "High yield non-destructive purification of single wall caron nanotubes monitored by EPR measurements", Nanotechnology, 2002. IEEE-Nano 2002; Proceedings of the 2002 2nd IEEE conference; Aug. 26, 2002; Piscataway, NJ, USA.

* cited by examiner

*Primary Examiner*—Timothy C Vanoy
*Assistant Examiner*—Serena L Hanor
(74) *Attorney, Agent, or Firm*—Winstead PC

(57) ABSTRACT

The present invention is directed to methods of purifying carbon nanotubes (CNTs). In general, such methods comprise the following steps: (a) preparing an aqueous slurry of impure CNT material; (b) establishing a source of $Fe^{2+}$ ions in the slurry to provide a catalytic slurry; (c) adding hydrogen peroxide to the catalytic slurry to provide an oxidative slurry, wherein the $Fe^{2+}$ ions catalyze the production of hydroxyl radicals; and (d) utilizing the hydroxyl radicals in the oxidative slurry to purify the CNT material and provide purified CNTs.

26 Claims, 6 Drawing Sheets

PURIFICATION OF CARBON NANOTUBES BASED ON THE CHEMISTRY OF FENTON'S REAGENT

CROSS-REFERENCE TO RELATED APPLICATIONS

This Application for Patent claims priority to U.S. Provisional Patent Application Ser. No. 60/639,500, filed Dec. 28, 2004.

This invention was made with support from the National Science Foundation, Grant No. DMR-0073046.

FIELD OF THE INVENTION

The present invention relates generally to carbon nanotubes, and specifically to carbon nanotube purification processes that are chemically selective and industrially viable.

BACKGROUND OF THE INVENTION

Carbon nanotubes (CNTs) are self-assembling nanostructures comprised of graphite sheets rolled up into cylinders [Iijima, *Nature,* 1991, 354, 56-58]. Such nanostructures are termed single-walled carbon nanotubes (SWNTs) if they are comprised of a single cylindrical tube [Iijima et al., *Nature* 1993, 363, 603-605; and Bethune et al., *Nature* 1993, 363, 605-607]. CNTs comprising two or more concentric tubes are termed double-walled carbon nanotubes (DWNTs) and multiwall carbon nanotubes (MWNTs), respectively. Regarding SWNTs, the diameter of these species can typically range from 0.4 nm to ca. 3 nm, and the length from ca. 10 nm to centimeters.

CNTs have found use in a wide variety of applications including conductive and high-strength composites, electrode materials for high capacity batteries, efficient field emission displays and radiation sources, and functional nanoscale devices [Baughman et al., *Science,* 2002, 297, 787-792]. However, the primary barriers to their widespread use remain the high costs involved in their synthesis and purification.

SWNTs are currently produced in a variety of ways, including arc discharge, laser oven, and chemical vapor deposition (CVD). While efforts are being made to scale up the production of these materials, all currently known synthesis methods result in large amounts of impurities in the product. For example, carbon-coated metal residues typically comprise 20-30 wt % of HiPco-produced CNT material [Nikolaev et al., *Chemical Physics Letters,* 1999, 313, 91-97], and ca. 60% non-nanotube carbon is formed in the arc discharge process. Both the metal and carbonaceous impurities can compromise the performance of carbon nanotubes in many applications.

Most current processes for purifying CNTs rely on one or both of the following steps: (1) removing the carbon coating that encapsulates the metal catalysts via oxidation with $O_2$, $CO_2$, or $H_2O$ vapor, at temperatures of 300-800° C. [e.g., Chiang et al., *J. Phys. Chem. B* 2001, 105, 1157-1161; Chiang et al., *J. Phys. Chem. B* 2001, 105, 8297-8301], or by wet chemical oxidation with oxidants including nitric acid, $H_2O_2$, or $KMnO_4$, during which sonication is frequently employed [e.g., Liu et al., *Science,* 1998, 280, 1253-1256]; and (2) using centrifugation or filtration to separate the CNTs from the soluble impurities [e.g., Bandow et al., *J. Phys. Chem. B,* 1997, 101, 8839-8842]. These aggressive processes typically result in severe damage to, and loss of, CNTs. Additionally, the processes are often limited to small batch yields, low yields, and/or low purity. Consequently, an efficient industrial scale purification process to remove these impurities is essential, as many of the applications of CNTs require highly-purified CNTs.

BRIEF DESCRIPTION OF THE INVENTION

The present invention is directed to methods of purifying carbon nanotubes (CNTs). In general, such methods comprise the following steps: (a) preparing an aqueous slurry of unpurified (or generally impure) CNTs; (b) establishing a source of $Fe^{2+}$ ions in the slurry to provide a catalytic slurry; (c) adding hydrogen peroxide to the catalytic slurry to provide an oxidative slurry; and (d) utilizing the oxidative slurry to purify the CNTs and provide purified CNTs. While not intending to be bound by theory, it is believed that the $Fe^{2+}$ ions catalyze the production of hydroxyl radicals, and that these hydroxyl radicals formed in the oxidative slurry then purify the CNTs. Additionally, in contrast to prior art purification methods that utilize hydrogen peroxide at ca. pH 7 and have very low yields, in some invention embodiments, hydrochloric acid is added to dissolve the iron, wherein such iron would otherwise remain in contact with the CNTs, presumably as precipitates of iron hydroxides, and continue catalyzing the digestion of SWNTs until the solution becomes clear.

In some embodiments, iron is present in unpurified CNT material as a result of iron being used in the synthesis of such CNTs (e.g., HiPco-produced CNTs). See Bronikowski et al., *J. Vac. Sci. Technol.* 2001, 19, 1800-1805; Nikolaev et al., *Chem. Phys. Lett.* 1999, 313, 91-97. In such embodiments then, it is a portion of the impurity that is a source of $Fe^{2+}$ ions. Such $Fe^{2+}$ ions can be generated through a combined action of the peroxide on the iron metal and a dissolution of any oxide and/or hydroxide formed from the action of the peroxide as $Fe^{2+}$ when the slurry is made acidic, thus establishing a concentration of $Fe^{2+}$ in the slurry.

In some or other embodiments, $Fe^{2+}$ can be established by adding an iron salt to the slurry. In some of these embodiments, the iron salt merely seeds the slurry when the slurry already comprises iron as a result of impurities; whereas in some other embodiments, the source of the $Fe^{2+}$ in the slurry is exclusively the iron salt.

In some embodiments, a phase separation is allowed to occur between the initially dispersed CNTs and the aqueous solvent comprising the subsequently dissolved impurities. In some embodiments this phase separation is passive and a physical separation can be accomplished by simply decanting off the aqueous solution. In some or other embodiments, this physical separation is accomplished using filtration. In some embodiments, the purification process can be automated using a Soxhlet or Soxhlet-like extractor operating at a pressure lower than one atmosphere so as to slow the thermal decomposition rate of the hydrogen peroxide.

In some embodiments, a thermal annealing step is employed wherein the purified CNTs are heated at 400° C.-1000° C. in an 1-1000 torr atmosphere comprising a gaseous species selected from the group consisting of $H_2$, an inert gas such as $N_2$ or Ar, and combinations thereof; wherein such annealing serves to remove residual solvent and/or organic functional groups from the CNTs.

In some embodiments, the purification process can be carried out several times to yield CNTs of successively higher purity. In some of these embodiments, such multiple purifications can be carried out sequentially in an automated process for easier scalability in industrial-scale purifications. Such industrial-scale purifications will likely lead to large-scale quantities of highly purified CNTs for use in applications requiring such high levels of purity.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
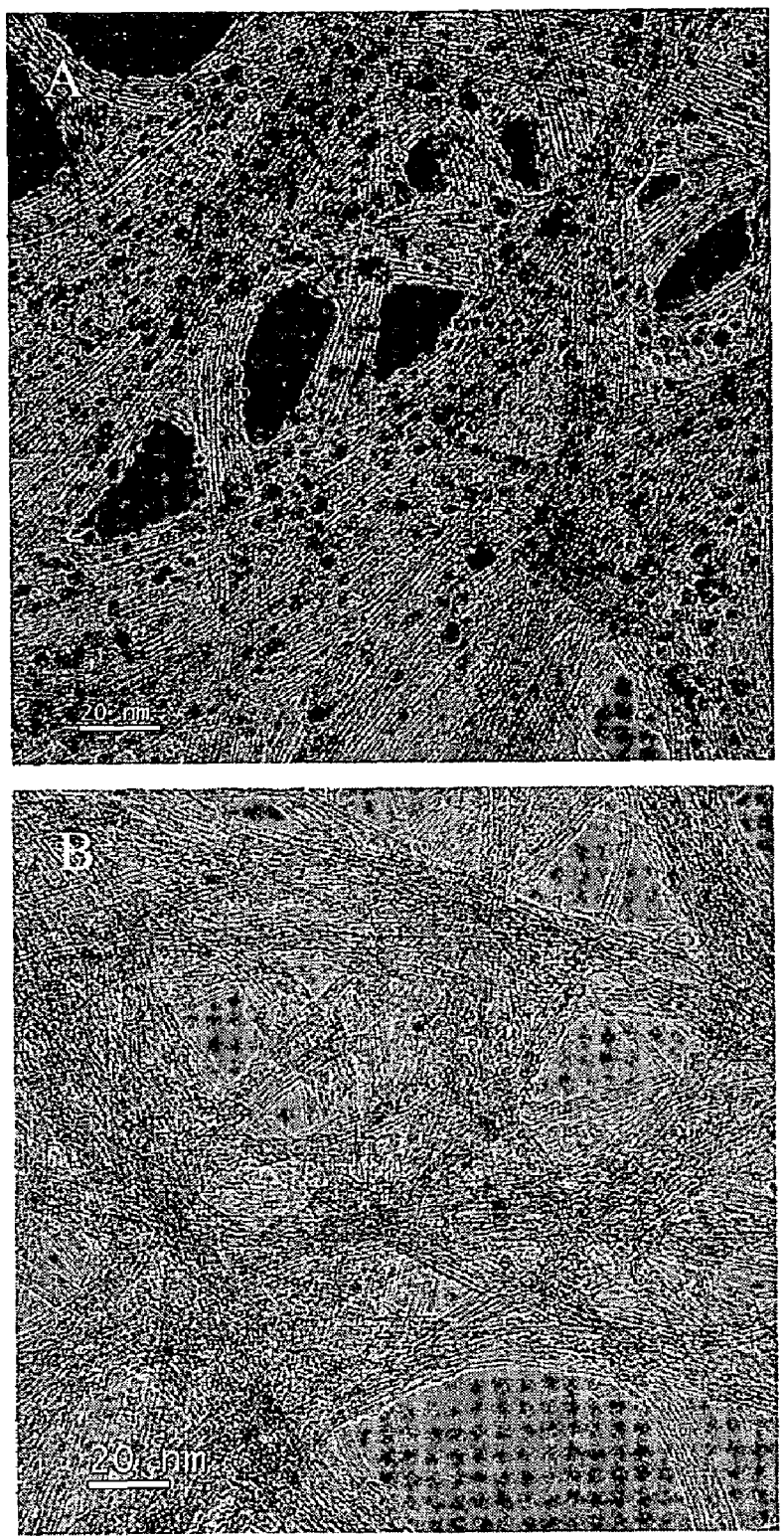
FIGS. 1A and 1B depict transmission electron microscopy (TEM) images of HiPco materials: (A) raw (unpurified) material, and (B) purified by $H_2O_2$/HCl, wherein the corresponding iron contents (determined from TGA) are reduced from 11 atomic % (raw, i.e., unpurified) to 1.0-1.6 atomic % (purified)

The present invention is directed to methods of purifying carbon nanotubes (CNTs) using Fenton's reagent. Such methods provide a solution-based purification of CNTs that is catalyzed by $Fe^{2+}$, and that is more efficient and less damaging than existing gas phase and solution-based oxidative purification methods.

CNTs, according to the present invention, include, but are not limited to, single-wall carbon nanotubes (SWNTs), double-wall carbon nanotubes (DWNTs), multi-wall carbon nanotubes (MWNTs), and combinations thereof. An exemplary class of CNTs for which the purification methods described herein are useful are small diameter carbon nanotubes (SDCNTs), generally having diameters of less than about 3 nm, irrespective of the number of tube walls they possess. All methods of making CNTs yield product with carbonaceous impurities. Additionally, most methods of making SWNTs, and many methods of making MWNTs, use metal catalysts that remain in the product as carbon-coated impurities.

The terms "carbon nanotube" and "nanotube" are used synonymously herein. The terms "unpurified CNTs" or "raw CNTs" generally refer to a CNT material comprising CNTs and impurities, typically in an as-produced state.

A variety of purification methods currently exist to purify the above-described CNTs (see Background section), but all result in considerable loss of nanotube product or otherwise low purity. Additionally, the CNTs can be chemically and structurally altered as a result of such purification processes.

Fenton's reagent (aka Fenton's chemistry) refers to an acidic mixture of hydrogen peroxide and ferrous salts, which is an effective oxidant widely used in the destruction of organic pollutants. Hydrogen peroxide itself is not an effective oxidant, but the ferrous salt catalyzes the production of hydroxyl radicals (.OH) in acidic solution by the reaction: $Fe^{2+}+H_2O_2+H^+\rightarrow Fe^{3+}+H_2O+.OH$. The hydroxyl radical is a much stronger oxidant than $H_2O_2$.

$H_2O_2$ alone has been used in the past to remove metals and non-nanotube carbon from raw CNT materials, but only with limited success. The problems are either low purity or low yield because the CNT materials are badly damaged and largely consumed during the purification process. Applicants report herein that, by carrying out the purification under acidic conditions where Fenton's chemistry occurs, both problems can be elegantly solved, thus making the purification with Fenton's reagent an ideal process for CNT materials such as raw (unpurified) HiPco® nanotubes (Carbon Nanotechnologies Inc., Houston, Tex.) that contain amorphous carbon-encapsulated iron metal [Bronikowski et al., *J. Vac. Sci. Technol.* 2001, 19, 1800-1805; Nikolaev et al., *Chem. Phys. Lett.* 1999, 313, 91-97]. Because HiPco-produced CNT material comprises iron particles in its unpurified state, it is an exemplary CNT material for purification by methods of the present invention.

Regarding the purification of the HiPco-produced nanotubes, previous experiments suggest that $H_2O_2$ itself is capable of etching the amorphous carbon coating to expose the encapsulated iron [Feng et al., *Chem. Phys. Lett.* 2003, 375, 645-648]. However, because the reaction is carried out at pH>5, the exposed iron remains in intimate contact with the nanotubes as iron or a ferric hydroxide precipitate that, in turn, acts as a catalyst to speed up the digestion (oxidation) of nanotubes along their length and/or cause damage to nanotube sidewalls.

Applicants have demonstrated that by adding hydrochloric acid (and in principle any other acids) to lower the pH to less than about 3, iron is released from the metal particles as $Fe^{2+}$ (or $Fe^{3+}$), thereby eliminating the iron and ferric hydroxide precipitates on the nanotubes and the associated aggravated catalyst effect in the consumption of the nanotubes. The $Fe^{2+}$, in turn, catalyzes the production of hydroxyl radicals, which are strong oxidants capable of reacting with the nanotube ends and non-nanotube carbon due to their more defective/strained structures. Since the reaction of hydroxyl radicals with nanotube ends becomes diffusion limited, the consumption of nanotubes is greatly minimized.

In some embodiments, the purification process is a simple one-pot process. In such embodiments, raw, iron-containing HiPco nanotubes can be mixed directly with water and stirred to form a slurry, the slurry is then acidified to a pH of 1-2 to form an acidic slurry that is then heated to ca. 60° C. $H_2O_2$ is added to the heated acidic slurry to yield an oxidative slurry with a $H_2O_2$ concentration in the range 5-35%. This oxidative slurry is held at ca. 60° C. for 1-4 hours, and then filtered (keeping the nanotube material wet) and washed with deionized water. This process may be repeated one to five times to yield higher levels of purification.

In some embodiments, $Fe^{2+}$ is added to the slurry in the form of an iron salt. In such embodiments, this can be done in the purification of HiPco CNTs, as above, where the added $Fe^{2+}$ serves to "seed" or initiate the reaction when the $H_2O_2$ is added, or it can be added to slurries comprising unpurified CNTs comprising no metal impurities or comprising metal impurities other than iron. Thus, the presence of $Fe^{2+}$ merely needs to be "established" in the slurry so as to provide for Fenton's reagent upon acidification and addition of $H_2O_2$.

The present invention provides for an industrially-viable purification process to remove from raw CNT materials metallic and other non-nanotube impurities, initially present at ca. 20-30 wt %, to a level less than about 1 wt %, which is sufficient to allow their use in many advanced applications such as composite materials, sensors, and nanoelectronic building blocks. While typically applied to unpurified CNT materials, methods of the present invention are generally applied to impure CNT materials, allowing for the possibility that such CNT materials have been at least partially purified prior to being subjected to the methods of the present invention.

For HiPco-produced CNTs in particular, Fenton's reagent is an efficient purification agent to remove metals and other non-nanotube impurities from the raw HiPco-produced material. This is because the iron already present as an impurity can be used as a catalyst to purify the CNTs.

The new processes/methods described herein possess several advantages over existing methods. Methods of the present invention yield CNTs with very high purity and yield. The reagents used in invention embodiments typically have an unusually high selectivity toward the removal of metals and other non-nanotube impurities, but are also generally non-destructive to nanotubes. By making the solution acidic, metal impurities (particularly iron) are dissolved, yielding a process that elegantly utilizes an impurity to facilitate purification. The dissolution and subsequent removal of iron not only avoids the aggressive iron-catalyzed Fenton's chemistry that could otherwise consume carbon nanotubes along their length, but also adds to the bulk solution the necessary $Fe^{2+}$ catalysts.

A second advantage to this process is that it is industrially viable. It is solution-based, involving mild conditions (e.g., 20-80° C. vs. 300-800° C. for gas phase purifications), a simple setup, virtually one-step operation, a fast turnaround (hours vs. days), and it is easy to automate. This novel process eliminates sonication, centrifugation, and filtration; steps typically employed in such purifications. Scaling up to an industrial scale is straightforward. Additionally, the major chemical, $H_2O_2$, is an inexpensive industrial reagent (ca. $0.50/pound). $H_2O_2$ is a relatively safe, effective, and environmentally-friendly oxidant; by-products from the reaction are relatively non-toxic. Such advantages permit industrial-scale purification, such purification ultimately being required for many applications of CNTs.

The following examples are provided to demonstrate particular embodiments of the present invention. It should be appreciated by those of skill in the art that the methods disclosed in the examples which follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLE 1

This example serves to illustrate how iron-containing unpurified CNTs can generally be purified using a one-pot process.

Water is added to raw CNT material to form a slurry that is heated to 20-80° C. (step 1). The pH of the slurry is adjusted and maintained at between about 1 and about 3 (step 2), and hydrogen peroxide is added to form an oxidative slurry and start the reaction of Fenton's reagent (step 3). The oxidative slurry is stirred for 0.5 to 2 hours (step 4). Phase separation is allowed to occur between the nanotubes and the solution (step 5), after which the slurry is decanted or filtered (step 6). The isolated, purified carbon nanotubes are then washed with acidic water until all exposed metal ions are removed (step 7). If desired, any of steps 1-7 are repeated one or more times.

EXAMPLE 2

This example illustrates some possible variations on the process described in the previous example.

The filtration to remove impurities can be automated using a principle similar to Soxhlet extraction. For example, the reaction container can be designed in a manner similar to that of a Soxhlet extractor, such that when the water solution surrounding the CNT sample (enclosed in a filter paper or a porous material) exceeds a certain level, it overflows and trickles back down into the accepting container. Water can be added at a programmed time to trigger the flush of the solution. $H_2O_2$, water, and other reactants could be added in a sequential manner to automate the process until the nanotube material is cleaned.

The purifed nanotubes, while still in water, may convert directly into what is known in the art as "bucky pearls" by adding hexane [Yang et al., U.S. Published Patent Application No. US 2003/02153803].

An iron containing salt (such as, but not limited to $FeSO_4$, $FeCl_2$, $FeCl_3$, $Fe(OH)_2$, Fe, and combinations thereof) can be added to the nanotubes/water slurry to initiate the purification reaction. Other metal ions such as Cu(I), Ti(III), Cr(II), Co(II), and Mn(III) could be used instead of Fe(II) to result in Fenton-like reagents.

Regarding reaction parameters, the pH of the slurry can more generally be in the range of pH 0 to pH 5, the reaction temperature can more generally be in the range of 20° C. to 100° C., and the concentration of $H_2O_2$ can more generally be in the range of 5% to 50%.

Other acids, such as $H_2SO_4$, could be used in place of the HCl. In particular, piranha, a mixture of $H_2SO_4$ (98%) and $H_2O_2$ (30%) mixed in 3:1 to 4:1 volume ratios, could be used to replace the $H_2O_2$/HCl solution. Because $H_2SO_4$ intercalates carbon nanotube ropes, the diffusion of $H_2O_2$ and $H^+$ into nanotube ropes could be more efficient relative to $H_2O_2$/HCl.

EXAMPLE 3

This example illustrates a particular procedure for the purification of raw HiPco-produced carbon nanotubes employing 4 cycles, 30 minutes each.

To 40.9 mg of raw HiPco material was added 20 ml of 1N HCl, to form an acidic slurry. This slurry was heated to 60° C. (hot plate) and stirred at 600 rpm. To this heated acidic slurry was added 20 ml $H_2O_2$ to form an oxidative slurry that continued to be heated and stirred for 30 minutes. The addition of HCl and $H_2O_2$, and subsequent heating and stirrings was repeated (i.e., cycled) three more times, each time allowing the heated oxidative slurry to stir for 30 minutes, and for an additional 60 minutes at 51° C. on the last cycle. Phase separation was allowed to proceed followed by filtering the carbon phase (upper layer on a filter paper) and washing with 1N HCl and nanopure water. The collected sample was dried at 120° C. in air for 2 hours. The purified product weight was 30.1 mg (carbon yield ca. 100%), and thermal gravimetric analysis (TGA) of the product (10° C./min) yielded 12 wt % $Fe_2O_3$, corresponding to 1.9 atomic % Fe. Raman and X-ray photoelectron spectroscopic (XPS) analysis followed.

EXAMPLE 4

This example illustrates a particular procedure for the purification of raw HiPco-produced carbon nanotubes employing 4 cycles, 1 hour each.

To 28.6 mg of raw HiPco material was added 20 ml of 1N HCl, to form an acidic slurry. To this acidic slurry was added 20 ml of $H_2O_2$ to form an oxidative slurry that was heated at 64° C. and stirred at 600 rpm for 1 hour. The addition of HCl and $H_2O_2$, and subsequent heating and stirrings was repeated three more times, each time allowing the heated oxidative slurry to stir for 1 hour, and for an additional 180 minutes on the last cycle. Phase separation was allowed to proceed followed by filtering the carbon phase (upper layer on a filter paper) and washing with 1N HCl and nanopure water. The collected sample was dried at 120° C. in air for 2 hours. The purified product weight was 18.9 mg (carbon yield 88%), and thermal gravimetric analysis (TGA) of the product (10° C./min) yielded 5.5 wt % $Fe_2O_3$ corresponding to 3.8 wt. % Fe. Raman and X-ray photoelectron spectroscopic (XPS) analysis followed.

COMPARATIVE EXAMPLE 5

This example is essentially the same as EXAMPLE 3, but without the addition of HCl to maintain the acidity between pH 1 and pH 3, thus illustrating the results respecting the pH.

To 24 mg of raw HiPco material was added 20 ml $H_2O$, to form a slurry. This slurry was heated to 60° C. (hot plate) and stirred at 600 rpm. To this heated slurry was added 20 ml $H_2O_2$ to form an oxidative slurry that continued to be heated and stirred for 30 minutes. The addition of $H_2O_2$, and subsequent heating and stirrings was repeated three more times, each time allowing the heated oxidative slurry to stir for 30 minutes and for an additional 60 minutes at 51° C. on the last cycle. The collected sample was rinsed with 500 ml of water, stirred in 80 ml 1N HCl, and rinsed with water. Transmission electron microscopy (TEM) samples were prepared at this point. The sample was then air dried at room temperature. Recovered product weight was only 4.4 mg (carbon yield=15%). TGA yielded 65 wt. % $Fe_2O_3$ ash content.

EXAMPLE 6

In the above-described examples, a number of analyses were performed. This example further describes these analyses and their results.

Figure 5:
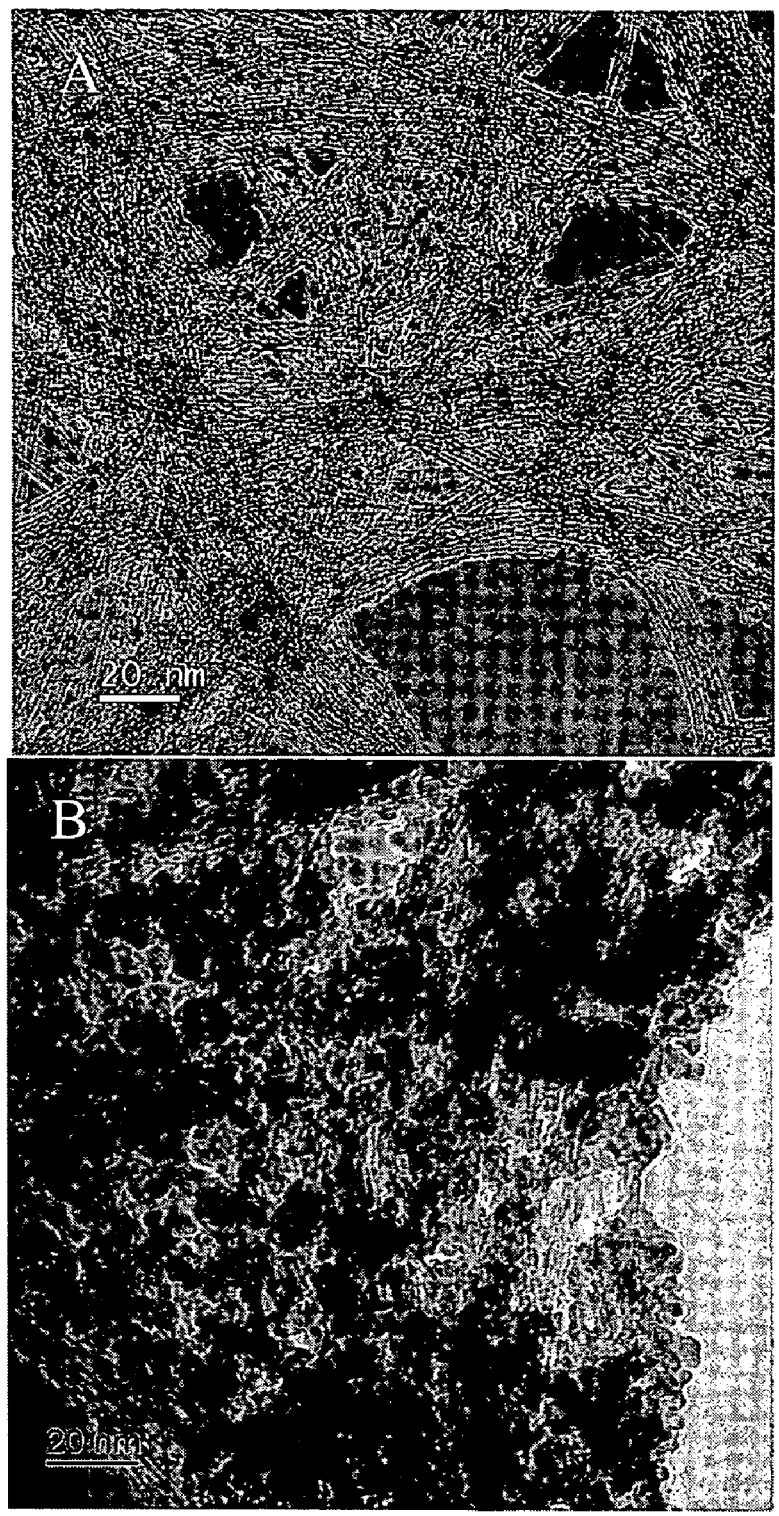
FIGS. 5A and 5B depict TEM images of HiPco materials after reacting at 60±5° C. with (A) a mixture of $H_2O_2$(30%)/HCl(1N) (1:1 volume ratio) for 1 hour (4 cycles), and (B) $H_2O_2$ (30%) for 18 minutes, wherein the solution was stirred at 600 rpm.

TEM is useful in visualizing the purity of a sample. While not quantitative, it provides some of the most direct evidence of nanotube purification. FIGS. 1A and 1B depict TEM images of HiPco-produced nanotube materials, wherein FIG. 1A depicts raw (unpurified) material, and FIG. 1B depicts such material after having been purified by $H_2O_2$/HCl, wherein the corresponding iron content (as determined by TGA) has been reduced from 11 atomic % (raw) to 1.0-1.6 atomic % (purified). FIGS. 5A and 5B depict TEM images of HiPco materials after reacting at 60±5° C. FIG. 5A depicts an image of such HiPco material after having been treated with a mixture of $H_2O_2$(30%)/HCl(1N) (1:1 volume ratio) for 1 hour (4 cycles), as in EXAMPLE 3. FIG. 5B depicts an image of such HiPco material after having been treated with $H_2O_2$ (30%) for 18 minutes, similar to the conditions described in COMPARATIVE EXAMPLE 5.

Figure 2:
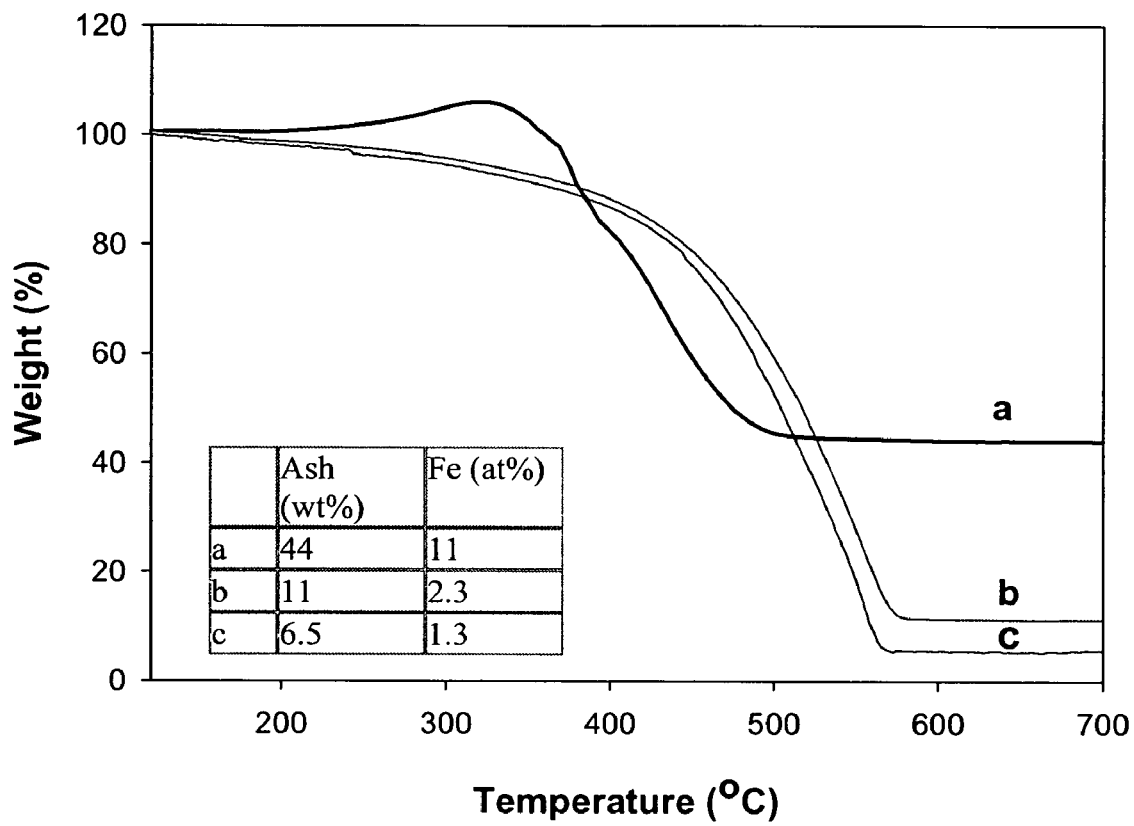
FIG. 2 depicts a thermogravimetric analysis (TGA) of HiPco materials in air: (a) raw materials, and purified with $H_2O_2$/HCl for (b) 0.5 hours, 4 cycles and (c) 1 hour, 4 cycles, wherein the temperature ramping rate was 10° C./min., and wherein the inset shows that the ash contents and the corresponding iron atomic percentages decrease as the time of treatment increases, while the carbon yield remains high (>74%)
Figure 6:
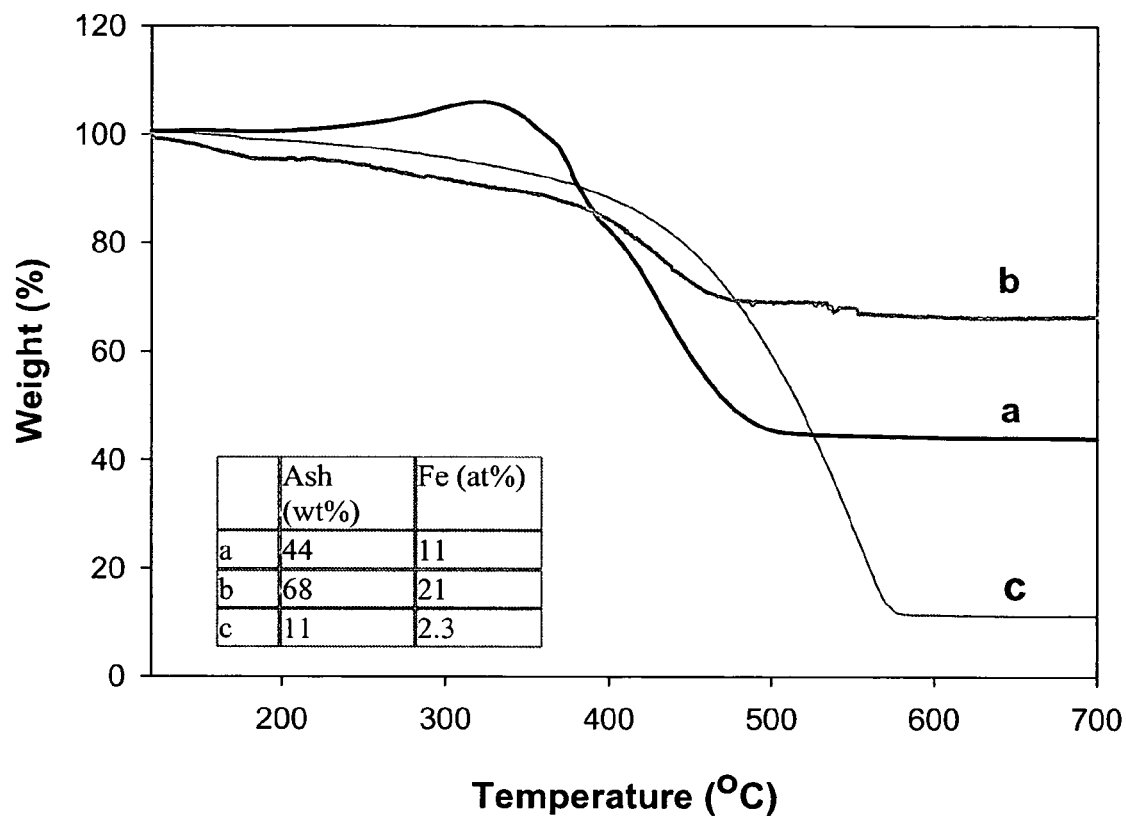
FIG. 6 depicts TGA of HiPco materials in air: (a) raw material, (b) purified with $H_2O_2$/HCl and (c) reacted with $H_2O_2$ (0.5 hour, 4 cycles), wherein the ramping rate was 10° C./min., and wherein the carbon yield of was 15% for $H_2O_2$, but approached 100% for $H_2O_2$/HCl.

Thermal gravimetric analysis (TGA) is used to oxidize carbon material to $CO_2$ by heating in an oxygen-containing environment. As $CO_2$ is evolved, the weight of the sample is monitored. When no further weight loss is observed, the sample has been reduced to ash and is primarily iron oxide ($Fe_2O_3$). FIG. 2 depicts a thermogravimetric analysis (TGA) of HiPco materials in air, wherein the various curves are (a) raw HiPco nanotubes, and HiPco nanotubes purified with $H_2O_2$/HCl for (b) 0.5 hours, 4 cycles and (c) 1 hour, 4 cycles, wherein the temperature ramping rate was 10° C./min., and wherein the inset shows that the ash contents and the corresponding iron atomic percentages decrease as the duration of treatment increases, while the carbon yield remains high (>74%). FIG. 6 depicts TGA of HiPco materials in air, wherein the various curves correspond to: (a) raw HiPco material, (b) HiPco material purified with $H_2O_2$/HCl and (c) HiPco material reacted with $H_2O_2$ (0.5 hour 4 cycles); wherein the ramping rate for each was 10° C./min., and wherein the carbon yield was 15% for $H_2O_2$ only-purified material, but approached 100% for $H_2O_2$/HCl purified material.

Figure 3:
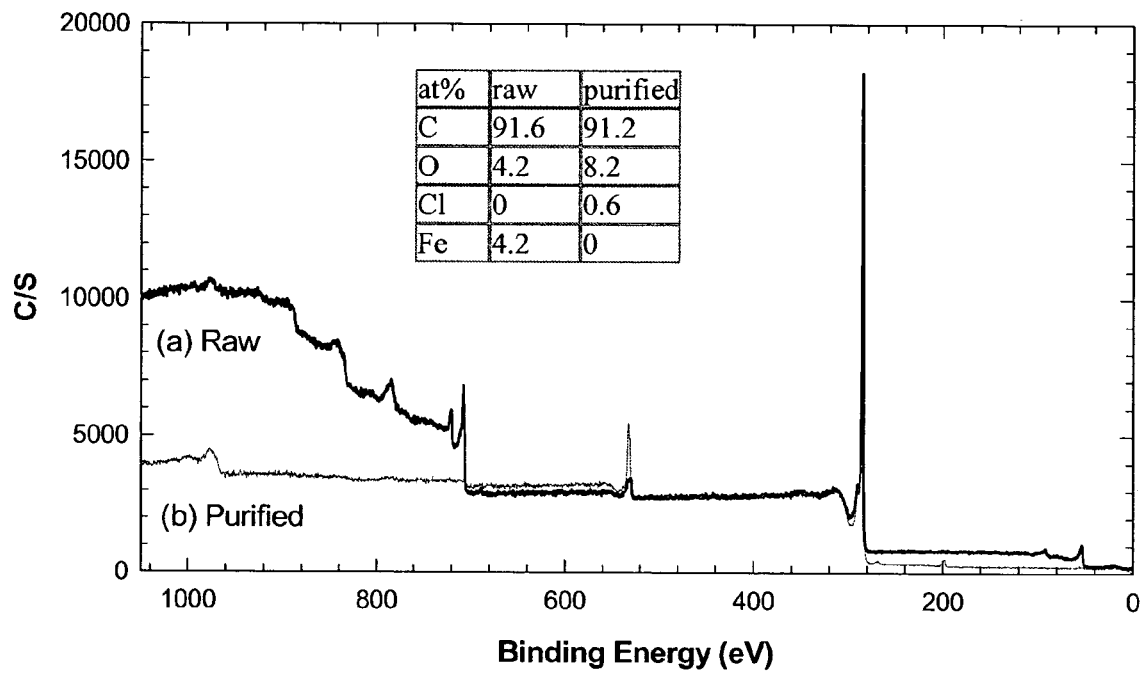
FIG. 3 depicts X-ray photoelectron spectroscopy (XPS) analysis of the HiPco materials: (a) raw material; (b) purified, wherein the amount of iron was reduced from 4.2 atomic % to an undetectable level, as determined by XPS.

X-ray photoelectron spectroscopy (XPS) is typically used to provide elemental analysis. It can also elucidate information about the oxidation states and environments of atoms within a sample. Being quite sensitive, it can also complement the data determined by TGA. FIG. 3 depicts XPS analysis of the HiPco materials, wherein the two spectra correspond to (a) raw HiPco material, and (b) HiPco material purified by the methods of the present invention, wherein the amount of iron was reduced from 4.2 atomic % to a level undetectable by XPS.

Figure 4:
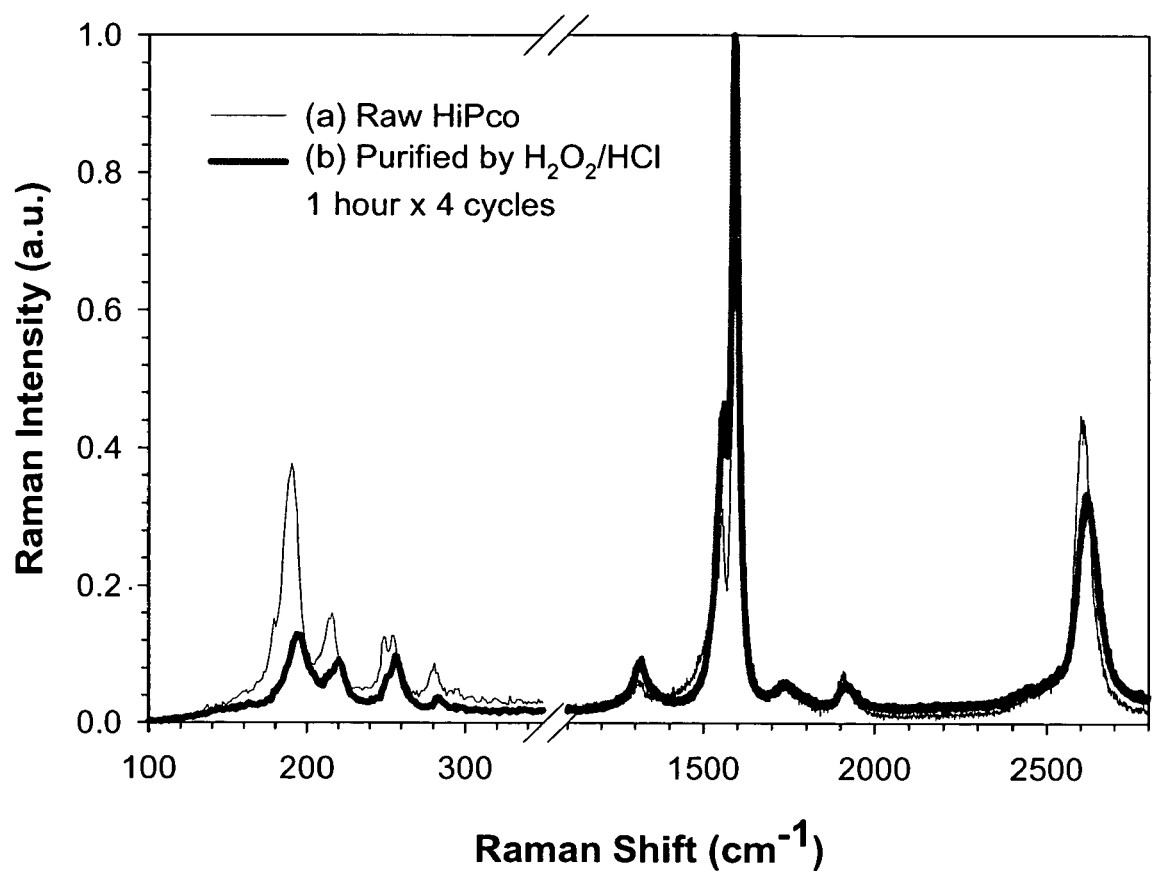
FIG. 4 depicts Raman spectra of HiPco materials: (a) raw; and (b) purified with $H_2O_2$/HCl (1 hour, 4 cycles), wherein the laser excitation line was 633 nm.

Raman spectroscopy provides a convenient, non-destructive analysis of CNTs, wherein the peak ratios are often dependent upon the excitation wavelength. FIG. 4 depicts Raman spectra of HiPco materials, wherein the two spectra correspond to (a) raw HiPco material, and (b) HiPco material purified with $H_2O_2$/HCl (1 hour 4 cycles, as in EXAMPLE 4), wherein the laser excitation line was 633 nm.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:
1. A method comprising the steps of:
 a) preparing an aqueous slurry of impure carbon nanotube (CNT) material, wherein the impure CNT material comprises Fe impurities and CNTs;

b) adding a non-oxidizing mineral acid to the aqueous slurry to adjust and maintain pH of said aqueous slurry between about 1 and about 3, thereby providing an acidic slurry;

c) adding hydrogen peroxide to the acidic slurry to form an oxidative slurry, wherein at least some of the Fe impurities are converted into $Fe^{2+}$, and wherein $Fe^{2+}$ present in the oxidative slurry catalyzes a production of hydroxyl radicals; and d) utilizing the hydroxyl radicals to purify the CNT material and provide purified CNTs.

2. The method of claim 1, wherein the CNTs in the impure CNT material are selected from the group consisting of single-wall carbon nanotubes, double-wall carbon nanotubes, multi-wall carbon nanotubes, and combinations thereof.

3. The method of claim 1, further comprising seeding the aqueous slurry with catalytic $Fe^{2+}$ by adding an iron salt.

4. The method of claim 1, further comprising stirring the oxidative slurry to facilitate purification.

5. The method of claim 1, further comprising a step of allowing phase separation to occur such that the purified CNTs are separated from other oxidative slurry components.

6. The method of claim 5, further comprising a step of decanting to additionally separate the purified CNTs from other oxidative slurry components.

7. The method of claim 1, further comprising a repetition of at least one of the steps of which the method is comprised.

8. The method of claim 1, wherein the non-oxidizing mineral acid is hydrochloric acid.

9. A method comprising the steps of:

a) preparing an aqueous slurry of impure carbon nanotube (CNT) material, wherein the impure CNT material comprises CNTs;

b) establishing a source of $Fe^{2+}$ ions in the aqueous slurry to provide a catalytic slurry;

c) adding a non-oxidizing mineral acid to the catalytic slurry to provide an acidic slurry;

d) adding hydrogen peroxide to the acidic slurry to provide an oxidative slurry with a pH between about 1 and about 3, wherein the $Fe^{2+}$ ions catalyze a production of hydroxyl radicals; and e) utilizing the hydroxyl radicals in the oxidative slurry to purify the CNT material and provide purified CNTs.

10. The method of claim 9, wherein the CNTs in the impure CNT material are selected from the group consisting of single-wall carbon nanotubes, double-wall carbon nanotubes, multi-wall carbon nanotubes, and combinations thereof.

11. The method of claim 9, wherein the source of $Fe^{2+}$ ions in the aqueous slurry is established by adding an iron salt.

12. The method of claim 9, further comprising stirring the oxidative slurry to facilitate purification.

13. The method of claim 9, further comprising a step of allowing phase separation to occur such that the purified CNTs are separated from other oxidative slurry components.

14. The method of claim 13, further comprising a step of decanting to additionally separate the purified CNTs from other oxidative slurry components.

15. The method of claim 9, further comprising a repetition of at least one of the steps of which the method is comprised.

16. The method of claim 9, wherein the non-oxidizing mineral acid is hydrochloric acid.

17. A method comprising the steps of:

a) preparing an aqueous slurry of impure carbon nanotube (CNT) material, wherein the impure CNT material comprises small-diameter carbon nanotubes;

b) establishing a source of $Fe^{2+}$ ions in the aqueous slurry to provide a catalytic slurry;

c) adding a non-oxidizing mineral acid to the catalytic slurry to provide an acidic slurry;

d) adding hydrogen peroxide to the acidic slurry to provide an oxidative slurry with a pH between about 1 and about 3, wherein the $Fe^{2+}$ ions catalyze a production of hydroxyl radicals; and e) utilizing the hydroxyl radicals in the oxidative slurry to purify the CNT material and provide purified CNTs.

18. The method of claim 17, wherein the source of $Fe^{2+}$ ions in the aqueous slurry is established by adding an iron salt.

19. The method of claim 17, further comprising stirring the oxidative slurry to facilitate purification.

20. The method of claim 17, further comprising a step of allowing phase separation to occur such that the purified CNTs are separated from other oxidative slurry components.

21. The method of claim 20, further comprising a step of decanting to additionally separate the purified CNTs from other oxidative slurry components.

22. The method of claim 17, further comprising a repetition of at least one of the steps of which the method is comprised.

23. The method of claim 17, wherein the non-oxidizing mineral acid is hydrochloric acid.

24. A method comprising the steps of:

a) preparing an aqueous slurry of impure carbon nanotube (CNT) material, wherein the impure CNT material comprises CNTs;

b) establishing a source of metal ions in the aqueous slurry to provide a catalytic slurry;

c) adding a non-oxidizing mineral acid to the catalytic slurry to provide an acidic slurry;

d) adding hydrogen peroxide to the acidic slurry to provide an oxidative slurry with a pH between about 1 and about 3, wherein the metal ions catalyze a production of hydroxyl radicals; and e) utilizing the hydroxyl radicals in the oxidative slurry to purify the CNT material and provide purified CNTs.

25. The method of claim 24, wherein the metal ions are selected from the group consisting of Cu(I), Ti(III), Cr(II), Co(II), Mn(III), and combinations thereof.

26. The method of claim 24, wherein the non-oxidizing mineral acid is hydrochloric acid.

* * * * *